United States Patent [19]

McCambridge

[11] Patent Number: 4,689,802

[45] Date of Patent: Aug. 25, 1987

[54] DIGITAL PULSE WIDTH MODULATOR

[75] Inventor: John M. McCambridge, Northville, Mich.

[73] Assignee: Chrysler Motors Corporation, Highland Park, Mich.

[21] Appl. No.: 866,631

[22] Filed: May 22, 1986

[51] Int. Cl.⁴ .............................................. H03K 7/08
[52] U.S. Cl. .................................... 375/22; 332/9 R; 364/200
[58] Field of Search ................. 375/22; 332/9 R, 9 T; 328/58, 185; 364/200; 340/825.63; 363/41; 318/599, 810, 811

[56] References Cited

U.S. PATENT DOCUMENTS 4,138,632 2/1979 Pauwels et al. ...................... 318/599
4,617,675 10/1986 Ashikaga et al. ..................... 375/22

Primary Examiner—Benedict V. Safourek
Attorney, Agent, or Firm—Mark P. Calcaterra

[57] ABSTRACT

A digital pulse width modulator for generating output frequencies with adjustable pulse widths that can be controlled by a microcomputer interface. This allows the traditional uses of PWMs to enter the realm of microcomputer systems.

4 Claims, 13 Drawing Figures

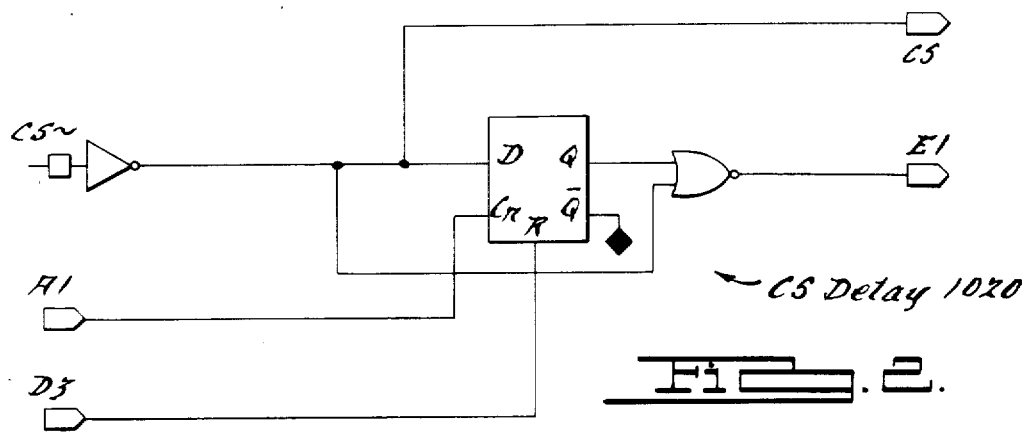
FIG. 2. CS Delay 1020
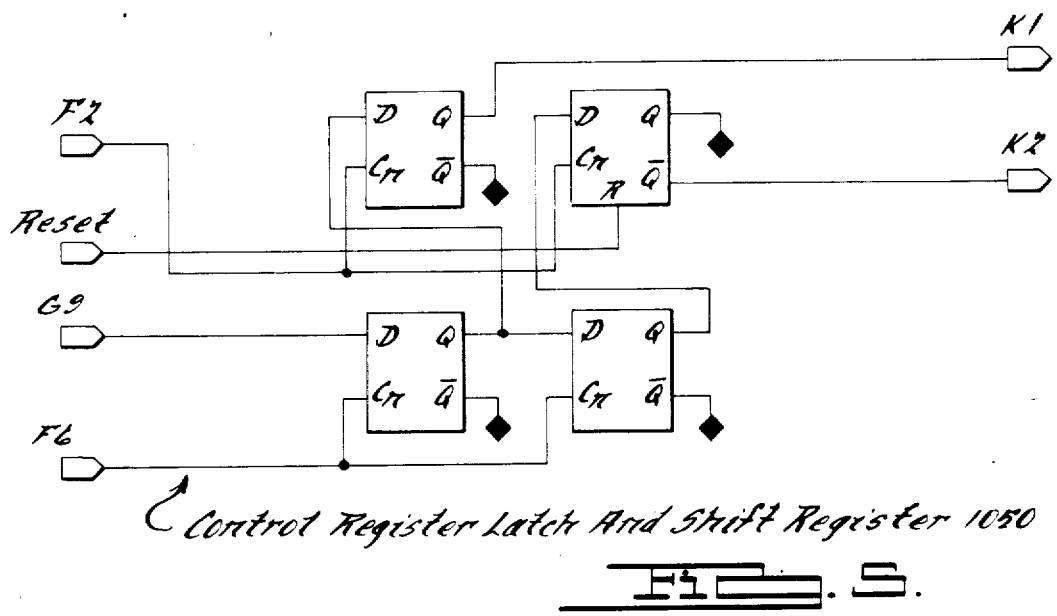
Control Register Latch And Shift Register 1050
FIG. 5.
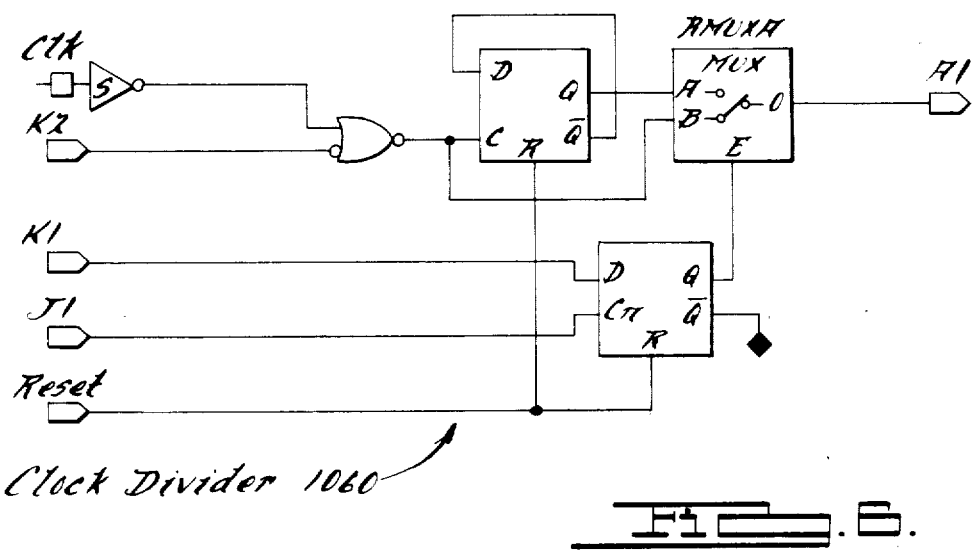
Clock Divider 1060
FIG. 6.

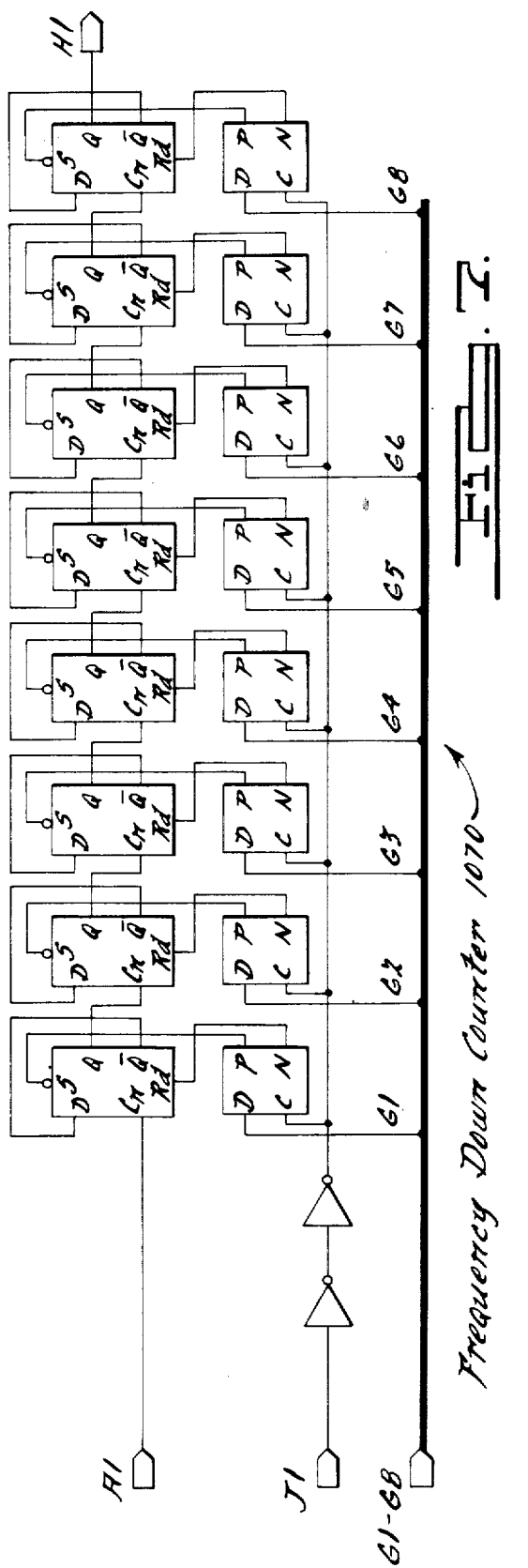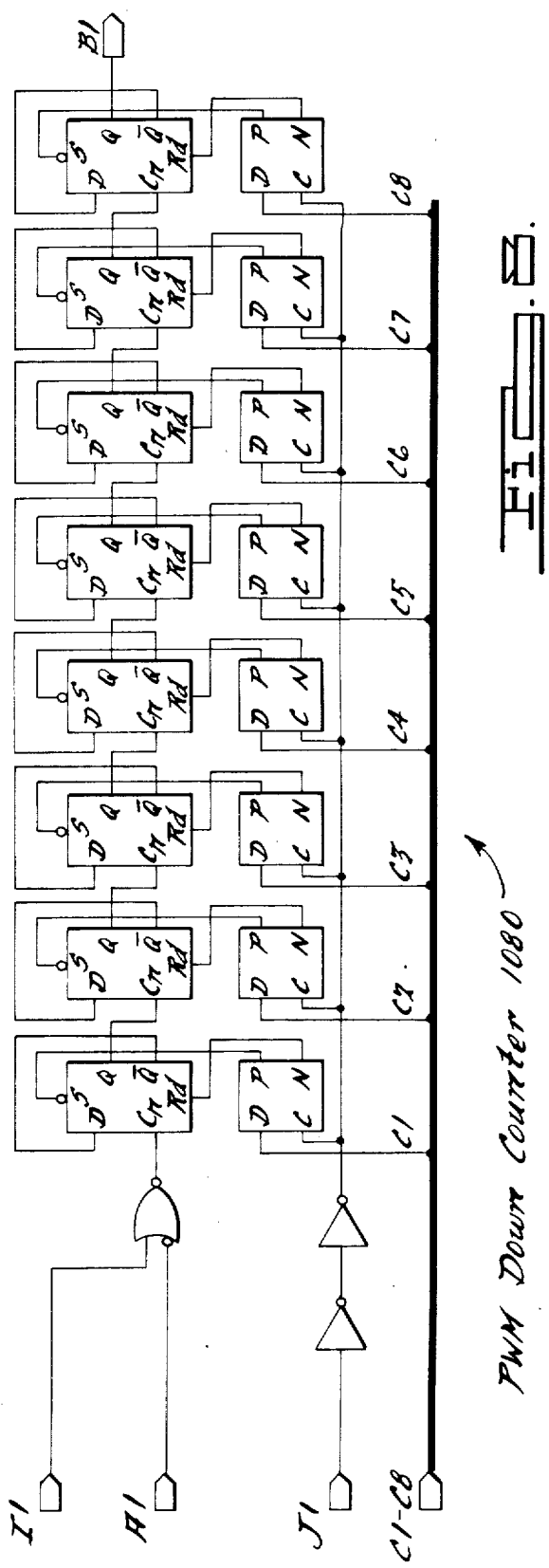

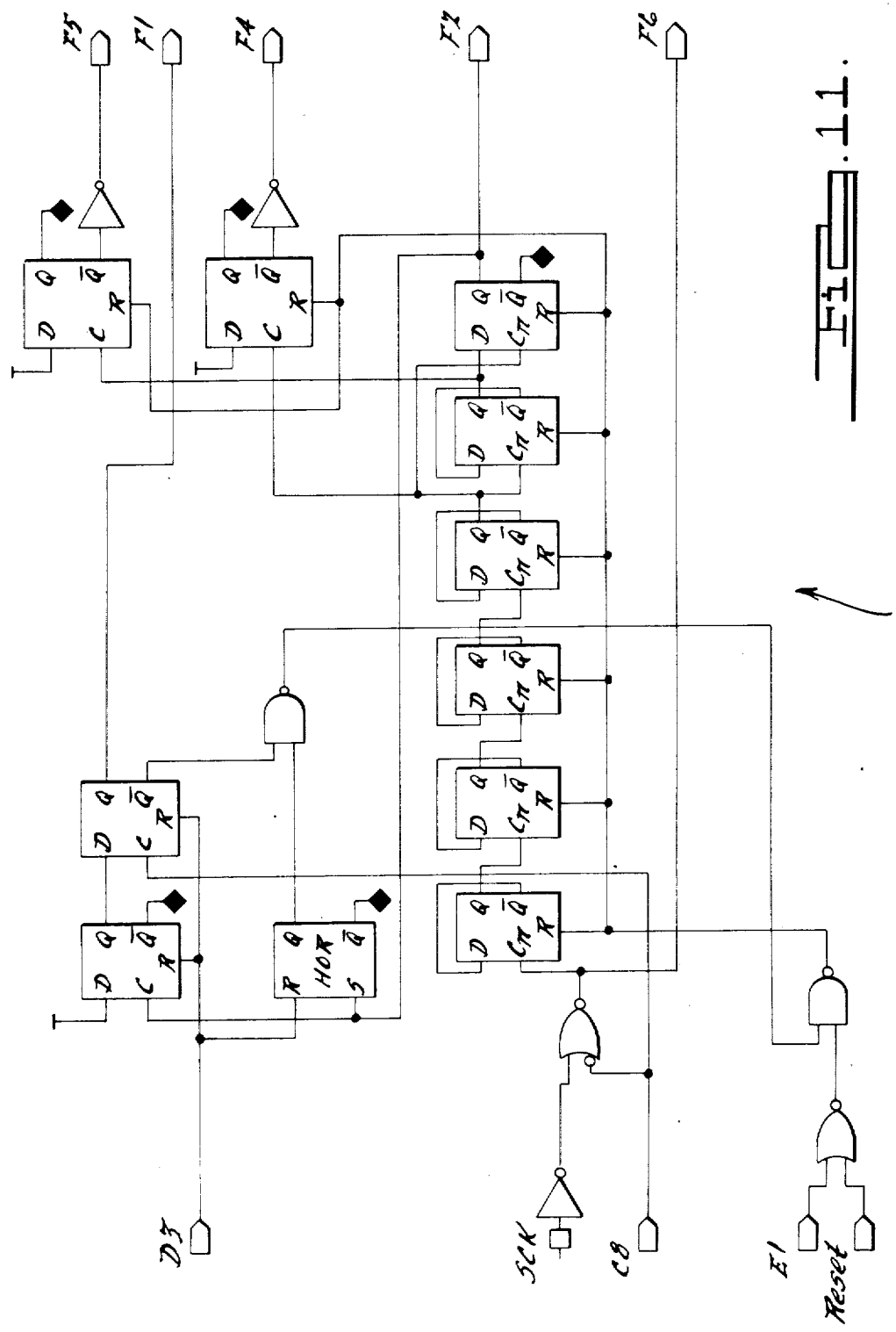

DIGITAL PULSE WIDTH MODULATOR

BACKGROUND OF THE INVENTION

1. Field of the Invention

The digital pulse width modulator (DPWM) is a device which allows creation of an output, a designated frequency and pulse width, and further allows the varying of the pulse width (on-time) or frequency of the waveform.

Typically, the device is set up at one frequency, and on-time of the waveform is made larger or smaller or left alone to produce the desired effect.

Applications for this device in microprocessor circuits are:

1. voice synthesis where the output pulse width is low pass filtered to produce an analog waveform. The larger the pulse width, the larger the analog voltage at the output of the low pass filter; the smaller the pulse width, the smaller the analog voltage at the output of the low pass filter.
2. a vacuum fluorescent power supply. Here the output pulse width drives a transistor which drives current through a coil, so the larger the pulse width, the higher the current and the higher the voltage generated. The smaller the pulse width, the smaller the current, and the smaller the voltage generated.

2. Prior Art

Examples of pulse width modulators are described in the following U.S. Pats.

U.S. Pat. No. 4,386,311 to Michael P. Bafaro; "Dual Slope Pulse Width Modulation Regulator and Control System"; discloses a dual slope pulse width modulation regulator for separate control of two independently operative power supplies.

U.S. Pat. No. 4,353,115 to Ray Ruble et al.; "Apparatus For Synthesizing A Sinusoidal Output"; discloses a sinusoidal synthesizer which produces a sinusoidal AC power output from a modulated pulse train. A pulse width modulator is used in the control of an output voltage in combination with a high gain negative feedback signal.

U.S. Pat. No. 4,105,939 to Charles H. Culbertson; "Direct Digital Technique For Generating An AC Waveform"; discloses the generation of a three-phase pulse width modulated output for driving the power stages with a rod control mechanism in a nuclear reactor facility.

U.S. Pat. No. 4,099,109 to Alberto Abbondanti; "Digital Apparatus For Synthesizing Pulse Width Modulated WaveForms And Digital Pulse Width Modulated Control System"; discloses as induction motor driver with adjustable speeds which responds to stored pulse width modulated waveforms which represent predetermined patterns of output voltage levels.

U.S. Pat. No. 4,072,206 to Gerald L. Larson et al.; "Device For Regulating Vehicle Road Speed"; utilizes a control pulse width for each mile per hour vehicle speed variation about a set speed.

U.S. Pat. No. 4,065,765 to Peter B. Wagner; "Pulse-Width Demodulator And Information Storage Device"; discloses a device to convert a pulse width modulated word into a digital format.

U.S. Pat. No. 4,001,728 to Wolfger Schneider; "Digital Method Of Pulse Width Modulation"; discloses a method of encoding the information in a pulse width modulated signal.

SUMMARY OF THE INVENTION

This digital pulse width modulator integrated circuit (DPWM IC) is used for generating output frequencies with adjustable pulse widths (on times). Information can be encoded in these pulse widths.

Historically, pulse width modulators (PWM) have found uses in almost an infinite number of applications, such as communications, servo-motor controllers, D/A conversion, switching power supplies and dimming circuits, to name a few.

Prior art PWMs usually contain digital and analog circuitry to produce the varying pulse widths, in response to an input analog waveform.

The need existed to have a pulse width modulator, of total digital design, that could be controlled by the microprocessor interface.

This is desirable because microprocessors are prevalent in today's circuits. This allows the traditional uses of PWMs to enter the realm of microcomputer systems.

The DPWM in its preferred embodiment is a custom integrated circuit (IC) and is capable of being connected to a serial peripheral interface (SPI) on a microprocessor or microcomputer.

Upon power up, the output of the DPWM chip remains at a logical zero state until the DPWM IC is selected by the microcomputer, 24 bits of data are input into the DPWM IC, and the IC is deselected by the microcomputer.

The 24 bits of data are input such that the first 8 bits contain the power up/down and clock divider information; the second 8 bits contain the frequency data; and the third 8 bits contain the pulse width modulated data.

The data is input such that the most significant bit (MSB) is input first. The data is clocked in on a rising edge of the serial clock (SCK) pin by the microcomputer.

After power up, upon reception of the 24th bit, the data in the shift registers is transferred to the control, frequency and pulse width modulation registers on the falling edge of the 24th SCK pulse. At this point, the device will not start counting until the DPWM IC is deselected. This is true only after a power up condition.

It is an object of the subject invention to provide a pulse width modulator of all digital design which is capable of communication with a microcomputer via an SPI port.

DESCRIPTION OF THE DRAWINGS

Other objects, features and advantages of the present invention will become more fully apparent from the detailed description of the preferred embodiment, the appended claims and the accompanying drawings in which:

FIG. 2 is a schematic diagram showing the CS delay of the DPWM IC;

FIG. 5 is a schematic diagram showing the control latch and shift register of the DPWM IC;

FIG. 6 is a schematic diagram of the clock divider of the DPWM IC;

FIG. 7 is a schematic diagram showing the frequency down counter of the DPWM IC;

FIG. 8 is a schematic diagram showing the PWM down counter of the DPWM IC;

FIG. 11 is a schematic diagram showing the SCK counter and latch decoders of the DPWM IC;

DETAILED DESCRIPTION OF THE PREFERRED EMBODIMENT

This application is closely related to a commonly owned application filed the same day and entitled "Method For Chip Selection And Counting In A Digital Pulse Width Modulated Integrated Circuit," which is hereby expressly incorporated by reference.

Figure 1:
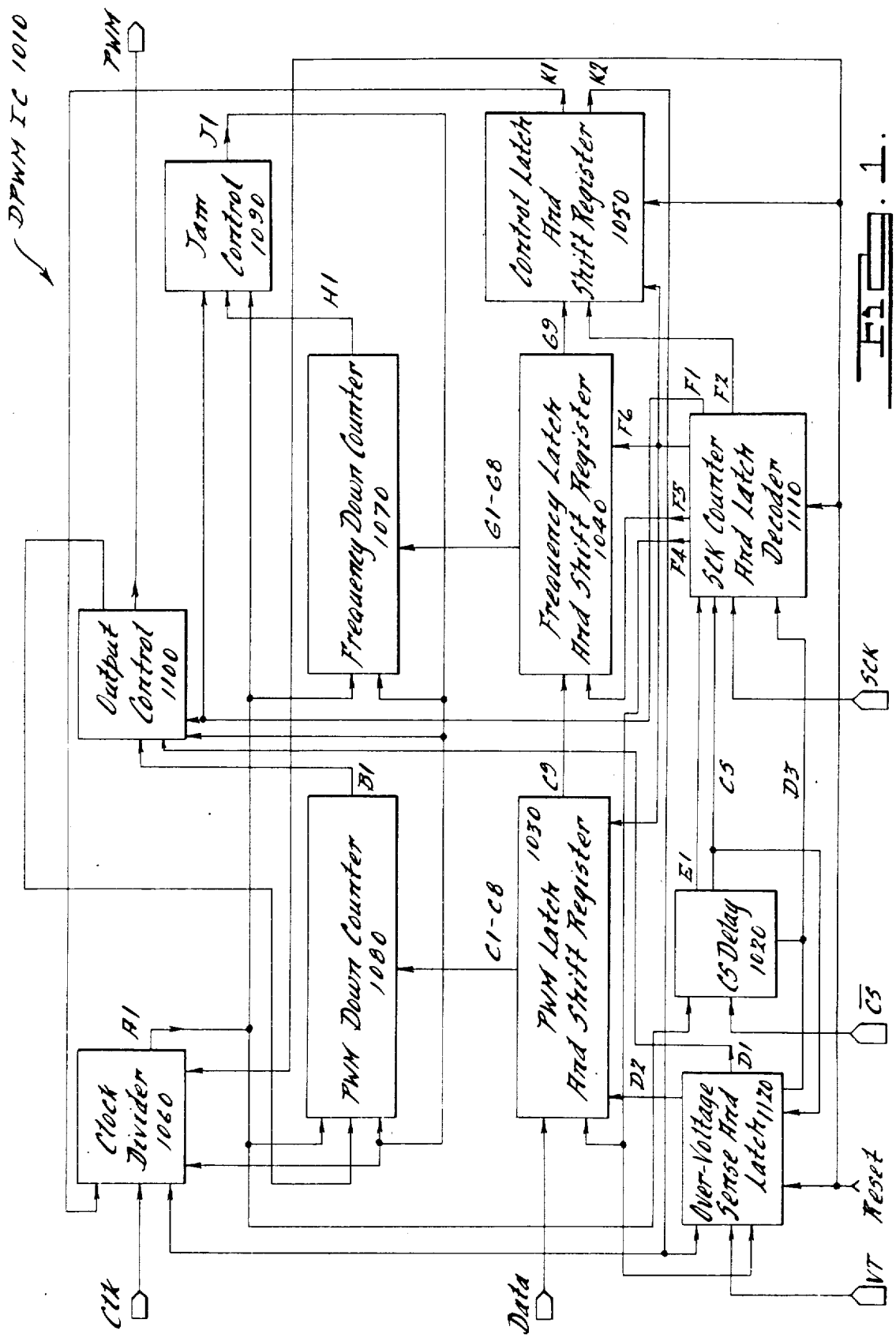
FIG. 1 is a block diagram of the digital pulse width modulated integrated circuit.

Referring to FIG. 1, to use this DPWM IC 1010, a user microprocessor or microcomputer (not shown) must provide an external clock signal to the CLK pin on the DPWM IC 1010. The CLK pin is located on the clock divider block 1060.

In addition, a microcomputer interface must be established. This will allow the user microcomputer to "talk" to the DPWM IC 1010. The interface must be a serial synchronous (clock and data) peripheral interface, commonly known as SPI, with a chip select (not shown).

The clock from the synchronous interface clock line must connect to the SCK pin on the DPWM IC 1010. The SCK pin is shown connected to the SCK counter and latch decoder block 1110 in FIG. 1. The data from the synchronous interface must connect to the DATA input pin on the DPWM IC 1010. The DATA pin is connected to the PWM latch and shift register 1030. The chip select output from the user microcomputer should go to the $\overline{CS}$ (an active low signal) input pin to block 1020, the CS delay circuit. The VT input pin to block 1120, the over-voltage sense and latch circuit, should be placed at a voltage of less than 0.6 volts.

Now, if the user microcomputer wishes to operate the DPWM IC 1010 for some application, the following will occur. Assuming for discussion purposes that the clock into the CLK pin on the DPWM IC 1010 is an eight Megahertz signal and that the user microcomputer desires an output frequency from the DPWM IC 1010 associated with that user microcomputer of 40 Kilohertz, the user microcomputer must first determine what number should be placed into the control latch and shift register 1050, frequency latch and shift register 1040 and PWM latch and shift register 1030.

In the control latch and shift register 1050, there are two bits, the second bit is a power up/down status and the least significant bit (LSB) is an input clock divider select bit which allows a divide by 2 or a divide by 1 in the clock divider circuit shown in block 1060.

It is desirable to keep the number in the frequency latch and shift register 40 as large as possible to give the largest number of pulse widths with which to work. Therefore, the clock divider bit in the control latch and shift register 50 should be selected at a logical zero level, which is a divide by 1. The power up/down bit should be selected as a logical zero level which will place the DPWM IC 1010 in the active state. A logical one level will put the DPWM IC 1010 device in a low power mode which would render the DPWM IC 1010 nonoperational.

Next, a number must be picked for the frequency latch and shift register 1040. The number is calculated using a formula:

$$Fout = 1/((Nfreq+1)*(CD+1)/Fclk)$$

where: Nfreq: is the number in the frequency register 1040

CD: is the bit that determine the clock divider (1 or 2)

Fclk: is the clock source frequency into the CLK pin on the DPWM

Therefore:

$$Nfreq = ((1/Fout)*(Fclk/(CD+1))) - 1$$

Now plugging numbers according to the assumed clock signal of 8 Megahertz and the desired output frequency of 40 Kilohertz:

$$Nfreq = ((1/40,000)*(8,000,000/(0+1))) - 1$$

$$Nfreq = 199$$

The last thing to calculate is the pulse width number Npwm that is desired for use in the PWM latch and shift register 1030. This can be calculated by the following formula:

$$Tpw = (Npwm+1)*(CD+1)/Fclk$$

Let's choose a pulse width Tpw of 1.25 microseconds.

$$Npwm = (Tpw*Fclk/(CD+1)) - 1$$

$$Npwm = (0.00000125*8,000,000) - 1$$

$$Npwm = 9.$$

At this juncture, the data must be put into the DPWM IC 1010. This data, when put into the DPWM IC 1010 with the serial synchronous peripheral interface, must be read into the chip with the most significant bit (MSB) first. To begin with, the control byte must be input, so the $\overline{CS}$ must be put into a low state. Next, the control byte must be input, MSB first. The first six bits in the control byte are either ones or a zero, the DPWM IC 1010 doesn't care which condition these bits are in, the last two bits, power up/down and the clock divider bit, are both zero. Data is accepted into the DPWM IC 1010 on the rising edge of the output from the SCK counter and latch decoder in block 1110. This output is labeled as F6 in FIG. 1.

Once the first eight bits are into the DPWM IC 1010, the same procedure must be followed for the frequency data to the frequency latch and shift register 1040 and the PWM latch and shift register 1030. When all of the data has been input into the DPWM IC 1010, the user microcomputer must place the $\overline{CS}$ at a high level. At this point, the output of the DPWM IC 1010 will go to a high level on pin PWM from output control block 1100. This output will stay high for 1.25 microseconds and then go low. It will go high again 23.75 microseconds later and the sequence will repeat itself. If the user microcomputer wishes to change the pulse width, all that is necessary to do is to select the DPWM IC 1010 via the $\overline{CS}$ input and follow with an input of eight bits, and the deselection of the DPWM IC 1010. If the user microcomputer wishes to change the frequency, the DPWM IC 1010 must be selected followed by an input of 16 bits and the deselection of the DPWM IC 1010. Furthermore, if the user microcomputer wishes to change the clock divider or power up/down bit, the DPWM IC 1010 must be selected followed by an input of 24 bits and then be deselected.

The VT input to block 1120, the over-voltage sense and latch circuit, is used if the DPWM IC 1010 is employed as a software control for a vacuum fluorescent voltage generation. Here, the output of the DPWM IC 1010 is connected to an NPN transistor, and in the emitter leg of the transistor, a small resistor is used to sample the current flowing through the transistor. If this current goes too high, thus causing the voltage across the resistor to rise above $0.75+/-0.15$ volts, the output of the DPWM IC 1010 will go to logical 0 state on PWM pin from the output control circuit 1100, until the voltage goes below $0.75+/-0.15$ volts and the user microcomputer again selects the DPWM IC 1010 followed by eight bits of data intended for the PWM latch and shift register 1030 followed by the deselection of the DPWM IC 1010.

Use of a power supply for vacuum fluorescent displays in an automotive environment is addressed in a commonly owned and pending patent application entitled "Power Supply For Vacuum Fluorescent Displays"; U.S. Ser. No. 812,473 filed on Dec. 23, 1985, the entire contents of which is hereby expressly incorporated by reference.

Internal IC Operation

When the DPWM IC 1010 is energized from a power up condition, (this is indicated when the internally generated RESET signal is at a logical one value) the PWM output pin from the output control circuit 1100 is set at a logical zero state. This logical zero state remains on the PWM pin until the DPWM IC 1010 is selected by a user microcomputer and 24 bits of information are input followed by a deselect of the DPWM IC 1010.

Referring again to FIG. 1, on the 24th falling edge, after a power up, of the SCK signal into block 1110, the SCK counter and latch decoder 1110 will latch data into the control latch and shift register 1050, the frequency latch and shift register 1040, and PWM latch and shift register 1030 via lines F4, F5 and F2. When an 8 or 16 bit update is made, lines F4 and F5 do not latch data into the PWM latch and shift register 1030 or the frequency latch and shift register 1040 (or both) until the DPWM IC 1010 is deselected by the user microcomputer. This is determined from signal E1 in the CS delay circuit in block 1020.

Referring now to FIG. 2, in conjunction with the block diagram in FIG. 1, the CS delay circuit 1020 does not let any updates to the latches be made while the internal counters are being refreshed. If the CS delay circuit 1020 was not working or present, erroneous pulse widths or frequency would randomly occur.

The way the CS delay circuit 1020 operates is keyed to the falling edge of the clock signal A1 from the clock divider circuit 1060. That is, the PWM down counter circuit 1080 and the frequency down counter 1070 increment on the falling edge of the signal A1.

The CS delay circuit 1020 guarantees that any deselection of the DPWM IC 1010 ($\overline{CS}$ going to a logical high level) will always happen at the falling edge of the clock signal A1. This ensures proper set up times for the jamming circuitry within the PWM down counter 1080 and the frequency down counter 1070. The jamming circuitry in 1080 tells the jam control circuit in 1090 when to jam data. This, in effect, controls the jamming or preloading of data into the counters 1080 and 1070 to control the numbers from which the counters count.

Signal E1 from the CS delay circuit 1020 tells the SCK counter and latch decoder 1110 when to latch data into the internal registers in the PWM latch and shift register 1030, the frequency latch and shift register 1040 and control latch and shift register 1050.

The CS delay circuit 1020 is reset during a power on reset (RESET) or from the internal shut down signal K2 from the control latch and shift register 1050. The two signals are combined in the over-voltage sense and latch circuit 1120 and enter on line D3.

Figure 3:
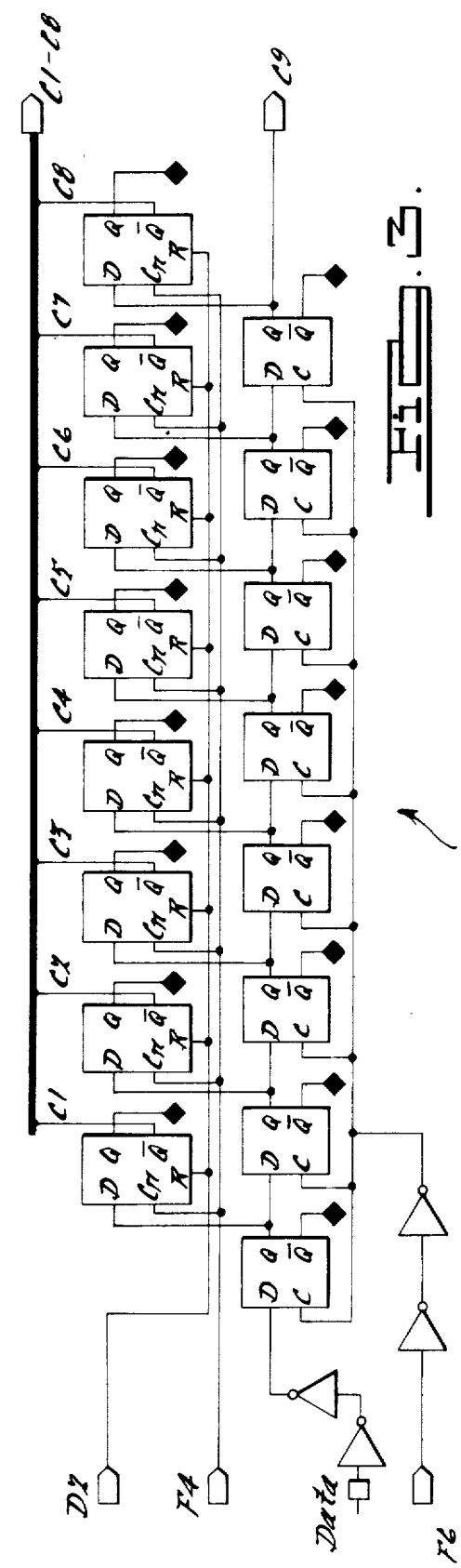
FIG. 3 is a schematic diagram showing the PWM latch and shift register of the DPWM IC.
Figure 4:
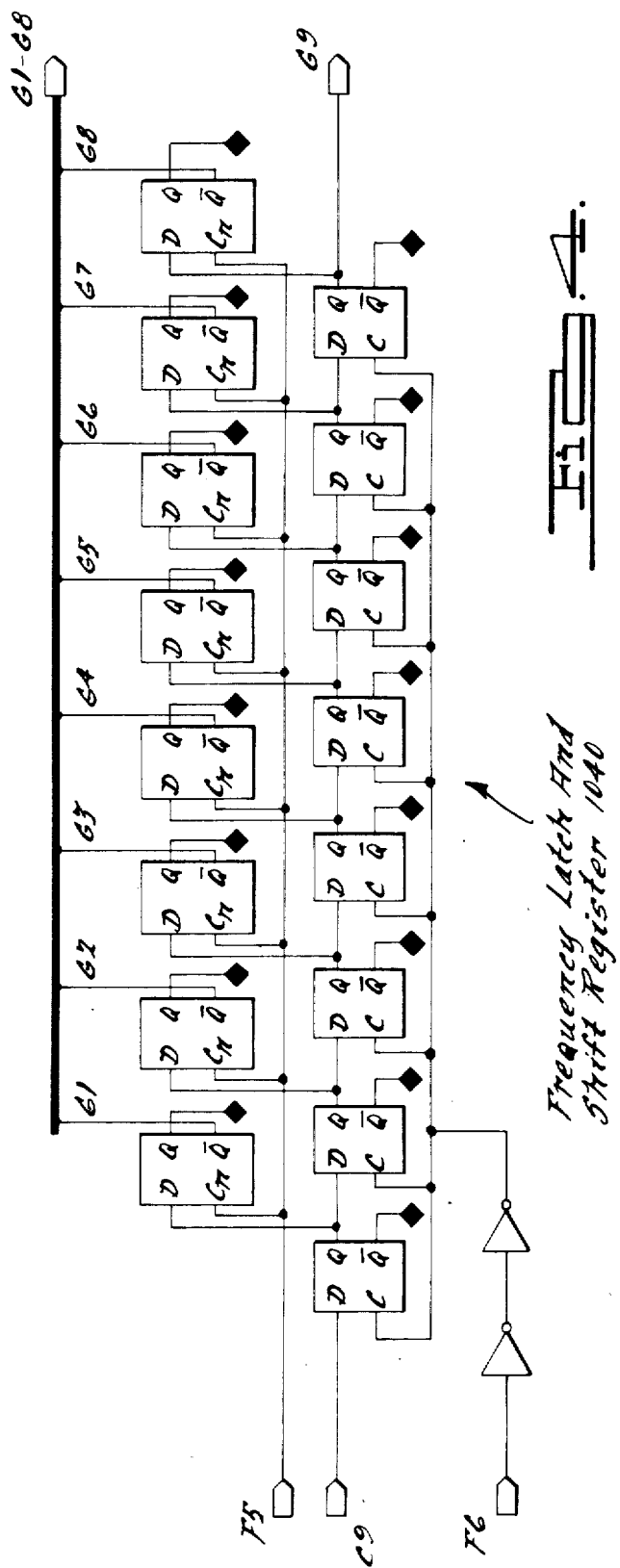
FIG. 4 is a schematic diagram showing the frequency latch and shift register of the DPWM IC.

Referring to FIG. 3, FIG. 4 and FIG. 5, the PWM latch and shift register 1030, frequency latch and shift register 1040 and control latch and shift register 1050 are illustrated. These three circuits are also shown in the blocks of FIG. 1. They act as shift registers and latches. Blocks 1030 and 1040 are each made up of 16 flip-flops and approximately 4 gates. The control latch and shift register 1050 is made up from 4 flip-flops.

Data from the user microcomputer enters the data pin into the PWM latch and shift register 1030 and when clocked 8 times by the F6 input 1030 from the SCK counter and latch decoder 1110, data flows out of input via line C9. Similarly, with the frequency latch and shift register 1040 and control latch and shift register 1050, when shifted eight more times from the F6 input line to the respective circuits 1040 and 1050, data flows out of line G9 from 1040 and into the control latch and shift register 1050. Data in circuit 1050 is shifted when the F6 input line is clocked. Note that the F6 input line is common to all three blocks, 1030, 1040 and 1050 in the shift register chain.

The signals that tell the PWM latch and shift register 1030, frequency latch and shift register 1040 and control latch and shift register 1050 when to latch, are on lines F4, F5 and F2, respectively.

The PWM latch and shift register 1030, along with the frequency latch and shift register 1040, pass data into the PWM down counter 1080 and frequency down counter 1070, respectively. The data is passed via the lines C1–C8 and G1–G8, respectively.

The control latch and shift register 1050 passes a bit of data to the clock divider circuit 1060 via line K1. This signal determines if the clock input is to be divided by 1 or 2. In addition, the signal on line K2, from the control latch and shift register 1050, tells the DPWM IC 1010 to be in a power up or power down mode. The power up/down signal on line K2 from the control latch and shift register 1050 will shut down the over-voltage sense and latch circuit in 1120 and stop the clock signal on line A1 from the clock divider circuit 1060. Doing this reduces the current draw in the DPWM IC 1010.

The clock divider circuit 1060 has five inputs and one output. This is shown in FIG. 1 and in FIG. 6. This circuit contains two flip-flops, one data multiplexer and two gates. The CLK input pin is the source clock signal for the DPWM IC 1010. The signal on line K2 from the control latch and shift register 1050 disables the clock in a power down mode. The input signal from the K1 line, also from 1050, determines whether a divide by 1 or a divide by 2 will take place in the clock divider 1060. The input signal on line J1 will let new "divide-by"

information from the signal on line K1 to be entered at a refresh time. The signal on line J1 comes from the jam control circuit 1090 and is activated when the frequency down counter 1070 circuit overflows. The signal on line A1 is the main clock output signal to the rest of the DPWM IC 1010 from the clock divider 1060. The $\overline{\text{RESET}}$ input to block 1060 will put the DPWM IC 1010 into a default condition which is a divide by 1 mode.

Referring now to FIG. 1 and to FIG. 7, the frequency down counter 1070 is illustrated. The frequency down counter 1070 sets up the repetition rate for the output frequency. The circuit 1070 is made up of eight D flip-flops that have $\overline{\text{set}}$ (active low) and reset inputs which are also connected to a jamming circuit. The jamming circuit within the frequency counter 1070 is made up of eight jammers. The jammers have two inputs and two outputs. The inputs are a data input and a control input. The outputs are labeled "P" and "N."

When the control input to a jammer is at a zero level, P and N outputs of the jammer are always 1 and 0, respectively. When the data input is at a 1 level and the control input is at a 1 level, the P and N outputs are both 0. When the data input is a 0 and the control input is a 1, the outputs P and N will be at a 1 level.

The P and N outputs of each jammer are then fed into the $\overline{\text{set}}$ and reset inputs on the D flip-flop. Therefore, it can be seen that when the data input on a jammer is a 1 and the control input on the jammer is a 1, that the D flip-flop will be reset. Likewise, when the data input to the jammer is a 0 level and the control input is a logical 1 level, the D flip-flop will be set.

Note the logic inversion that takes place and also note that when the control input is at a zero level that the outputs of the jammers P and N have no effect on the state of the flip-flop. The jammers get their data from the inputs G1–G8 from the frequency latch and shift register 1040. At the refresh time, a signal input on line J1 from the jam control circuit 1090 goes from a 0 level to a 1 level. This signal on line J1 is connected to the control input on the jammer circuits of the frequency down counter 1070. While the control input is a logical 0, the P and N outputs from the jammer have no effects on the D flip-flop. When the input on line J1 goes to a logic one, the data at the inputs G1–G8 is sent out the P and N outputs of the jammer.

Remember that this causes a logic conversion when the data appears at the output of the D flip-flops. For example, if a word of hexidecimal code OF is at the lines G1–G8, the one's complement or inverse of this data would yield a hexidecimal F0 in the counter 1070. This looks like a down counter to the user microcomputer. The user microcomputer thinks that if he inputs a OF into the DPWM IC 1010 that the counter 1070 would count down from OF to 00 and rollover to FF. What actually happens is that the ones complement (inversion) is taken giving F0 and the counter actually counts up from F0 to FF and rolls over to 00. When this roll-over takes place, the signal on line HI goes from a logical 1 to a logical 0. This, in turn, clocks the jam control circuit 1090 which, in turn, activates the output on the line J1 which tells the PWM down counter in 1080 and the frequency down counter 1070 to refresh themselves.

The frequency down counter 1070 is clocked by the signal on line A1 from the clock divider circuit 1060. That is, the counters in 1080 and 1070 will count up at a rate determined by the frequency of the signal on line A1. When the counters are refreshed, for example in the frequency down counter 1070, the data on lines G1–G8 is taken into the counter and a one's complement is taken and the one's complement is pre-loaded into the counter.

Referring now to FIG. 8 in conjunction with FIG. 1, the PWM down counter 1080 is shown. It works in exactly the same fashion as the frequency down counter 1070. It, however, takes its data inputs from the lines C1 ∝ C8 from the PWM latch and shift register 1030. The PWM down counter 1080 is signaled for refresh by the signal on line J1 from the jam control circuit in 1090. It is also clocked by a signal on line A1, but when the PWM down counter 1080 rolls over, indicated by an output signal on line B1 going from a logic 1 level to a logic 0 level, the signal on line B1 clocks the output control circuit 1100. This forces the PWM output pin from output control 1100 to go to a logical 0 level. At that time, another output from the output control circuit 1100 on line I1 will stop the PWM down counter 1080 from being clocked until the counter 1080 is refreshed by the signal on line J1 from the jam control block 1090.

Figure 9:
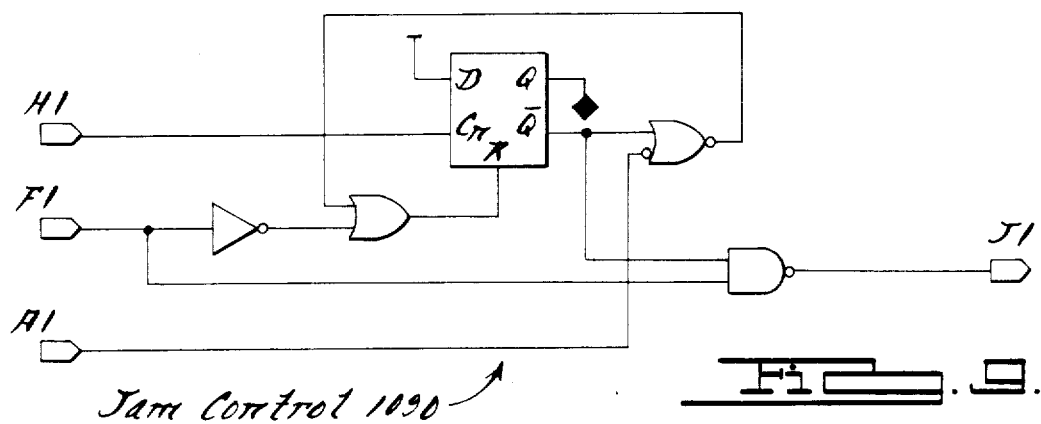
FIG. 9 is a schematic diagram of the jam control circuit of the DPWM IC.

Referring now to FIG. 9, in conjunction with FIG. 1, the jam control circuit 1090 is illustrated. The jam control circuit is made up of one D flip-flop and four gates. The purpose of this circuit is to signal the rest of the DPWM IC 1010 that the frequency down counter circuit in 1070 has overflowed and is being refreshed. Normally, the output of the jam control 1090 on line J1 is a logical 0 level. It will be at a logical 0 level until the frequency down counter 1070 overflows from a hexidecimal code word FF value to a hexidecimal 0 value. This is signaled to the jam control circuit 1090 from the input on line H1 from the frequency down counter 1070.

When the signal on line H1 makes a logical 1 to a logical 0 transition, the internal flip-flop in the jam control 1090 is clocked and the output on line J1 goes to a logical state. The input to the jam control 1090 on the line A1 will guarantee that the signal on line J1 is high for ½ of 1 cycle of the signal on line A1. This will allow adequate time for the counters to be jammed.

Upon power up, the input on line F1 from the SCK counter and latch decoder 1110, will keep the output on line J1 high until 24 bits have been input and the DPWM IC 1010 is deselected.

This allows the counters to be jammed before the frequency down counter 1070 is started.

This is also true after the user microcomputer is trying to exit in the power down mode by setting the output on line K2 in the control latch and shift register 1050.

Figure 10:
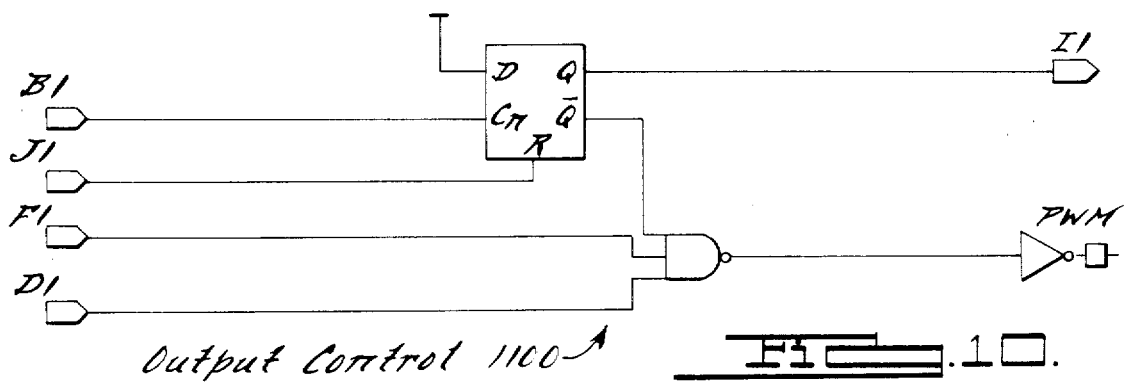
FIG. 10 is a schematic diagram of the output control circuit of the DPWM IC.

Referring now to FIG. 10, in conjunction in FIG. 1, the output control circuit in 1100 is illustrated. It is made up of 1 D flip-flop and 2 gates. The purpose of this circuit 1100 is to control the only output of the DPWM IC 1010 which appears on the PWM pin. The output control 1100 also has an output on line I1 which will disable the clock signal on line A1 to the PWM down counter in block 1080.

The input to the output control circuit 1100 on line F1 keep the output of the output control 1100 on pin PWM low after a power up condition (a power on reset or the internally generated down mode) until the DPWM IC 1010 is selected via the $\overline{\text{CS}}$ pin and 24 bits of data are input to the DPWM IC 1010 and the DPWM IC 1010 is deselected.

The input to output control 1100 on line D1 comes from the over-voltage sense and latch 1120 and, when low, this input will keep the output signal on pin PWM low until VT input on the DPWM IC 1010 is less than 0.75+/−0.15 volts and the DPWM IC 1010 is selected by the user microcomputer and 8 bits are input followed by a deselect of the DPWM IC 1010.

The signal on line D1 is normally a logical 1, but it goes to a 0 when an over-voltage condition occurs.

When the signal on line D1 is low, the output on the PWM pin will be low also. When the output on line D1 is at a logical 1 level, the output has no effect on the output signal presented to the PWM pin.

The input signal on line J1, when high, will reset the output control block 1100, thus forcing the output signal on pin PWM to a high level; this happens at the refresh time.

The signal input on line B1 from the PWM down counter 1080 will clock the output control block 1100 when the PWM down counter 1080 overflows. When it overflows, the signal on line B1 goes from a 1 to a 0 clocking the output control block 1100 and dropping the PWM down counter 1080 output from a 1 to a 0 level.

Referring now to FIG. 11, in conjunction with FIG. 1, the SCK counter and latch decoder 1110 is illustrated. It is made up of 11 flip-flops and 6 gates. The function of the SCK counter and latch decoder 1110 is to count the number of SCK pulses that enter the DPWM IC 1010 and determine, based on that number, which latches get updated from the data in the shift registers.

After a power up condition, whether it is from a power on reset or from an internally generated power up condition via the signal on line K2, the circuit 1110 waits for 24 bits of data to enter the DPWM IC 1010 as clocked by the SCK pin.

The user microcomputer must first make the $\overline{CS}$ input to the CS delay circuit 1020 equal to a 0 level. If the $\overline{CS}$ signal is not 0, the SCK counter and latch decoder 1110 will be reset as defined by the CS input to this circuit from the CS delay circuit 1020.

Given that the $\overline{CS}$ input is a logic 0 level, the user microcomputer must input 24 bits of data as clocked by the SCK input pin before the DPWM IC 1010 can become activated. If less than 24 bits have been input and the DPWM IC 1010 is deselected, CS equal to 1, then the DPWM IC 1010 will do nothing.

Until the 24 bits have been input, the output on line F1 will remain at a 0 level. When 24 bits have been clocked in and the DPWM IC 1010 is deselected, the signal on line F1 will go to a high level.

At the time of the 24th falling edge on the SCK line, data will automatically be latched into the 3 latches and shift register blocks 1030, 1040 and 1050. This is true only after a power up condition. This was done to give the comparator in the over-voltage sense and latch circuit 1120 adequate time to power up after being shut down. It also puts valid data into the three latches and counters in plenty of time before the deselection of the DPWM IC 1010, at which time the counters will begin to count.

If 24 bits are clocked in for a second time after the DPWM IC 1010 has been operating, the data is not automatically latched after the 24th SCK falling edge, but is only latched after the deselection of the DPWM IC 1010 via the $\overline{CS}$ pin.

The SCK counter and latch decoder 1110 can be reset by a power on reset, or by a power down condition as defined by the signal on line K2 from the control latch and shift register 1050 and the input to 1110 from the signal on line D3 from the over-voltage sense and latch 1120.

The SCK counter and latch decoder 1110 can also be reset by the signal on line E1 from the chip select CS delay circuit 1020. The signal on line F6 which originates from the SCK counter and latch decoder block 1110 is the SCK signal that is passed through a gate and sourced to other parts of the DPWM IC 1010. The purpose of the gate is to block any SCK pulses from entering the DPWM IC 1010 when the $\overline{CS}$ equals 1.

If the DPWM IC 1010 is selected, the signal output on line F4 will go high after 8 SCK pulses enter the chip. If the DPWM IC 1010 is deselected, as sensed by block 1110 through the input on line E1 from the CS delay block 1020, the output on line F4 will go low, thus latching data into the PWM latch and shift register 1030.

If the DPWM IC 1010 is selected and if 16 SCK pulses are sensed by block 1110, the outputs on line F4 and F5 will both go high and if the chip is deselected as sensed by the input signal on line E1, the signals on line F4 and F5 will go low, thus latching data into the PWM latch and shift register 1030 and the frequency latch and shift register 1040.

If the DPWM IC 1010 is selected and if 24 SCK pulses enter the block 1110, then the outputs on lines F2, F5 and F4 will all go high. When the $\overline{CS}$ input goes to a high level as sensed by the input by the input from line E1 from the CS delay circuit in 1020, this will drive the outputs on lines F2, F4 and F5 to a low condition. When they go low, all 3 shift registers/latch circuits will have new data latched into them.

One unique feature of this DPWM IC 1010 is that the frequency register can remain untouched if you only want to change the pulse width. This saves microcomputer time. The same is true if you want to change the frequency and pulse width without changing the control register.

Figure 12:
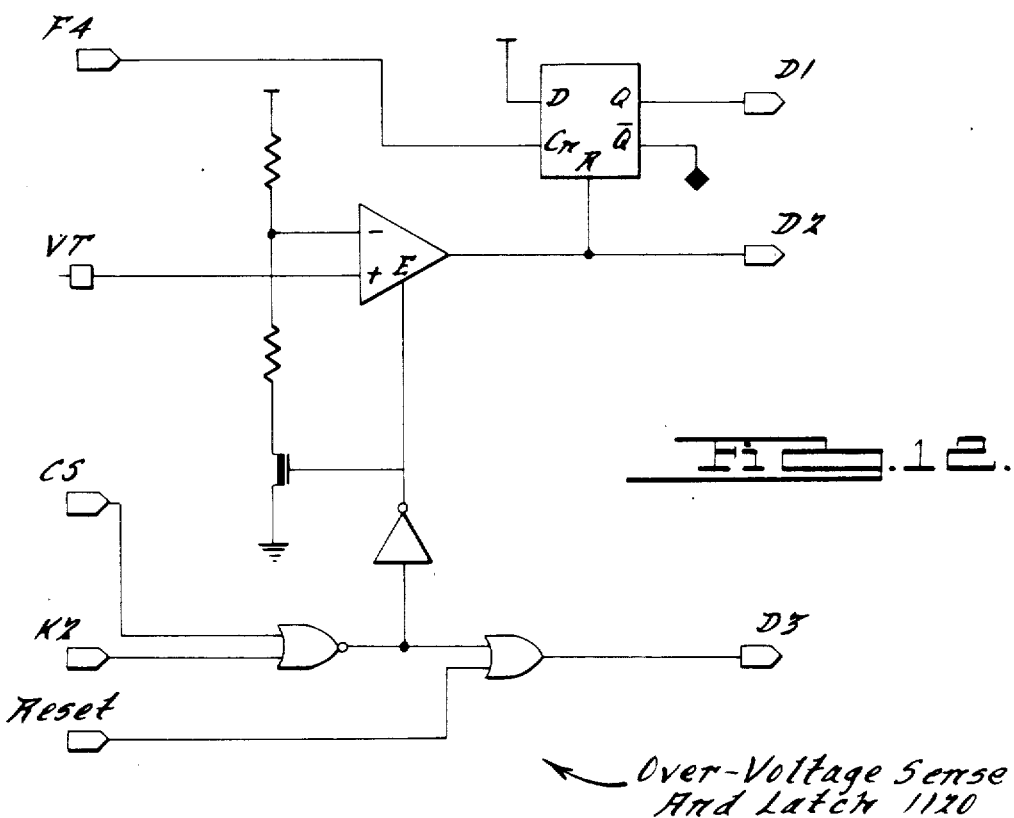
FIG. 12 is a schematic diagram showing the over-voltage sense and latch with the DPWM IC.

Referring now to FIG. 12, in conjunction with FIG. 1, the over-voltage sense and latch circuit 1120 is made up of a D flip-flop, 3 gates and a transistor, 2 resistors and a voltage comparator. The purpose of this circuit is to sense when the voltage on the VT input pin is greater than 0.75+/−0.15 volts.

When the voltage on this pin is less than 0.75 volts, the output of the comparator will be low. If the voltage on the VT pin is greater than the 0.75 volts, then the output of the comparator will be high. The 0.75 voltage reference is determined by the two resistors.

Under normal operation, the VT pin is less than 0.75 volts. Thus, the output of the comparator will be low and after the DPWM IC 1010 is selected and 8 bits have been input, and the chip deselected, the output of the circuit 1120 on line D1 will be high. This, when passed over to the output control circuit 1100, will not effect the output on pin PWM. If, however, the VT pin goes above the 0.75 voltage limit, then the comparator output will go high, thus driving the output on pin D1 low. This will, when passed to the output control 1100, drive the PWM pin output to a low condition. The purpose of this is best seen in the control of the switching power supply. If the current in a sense resistor went too high, the PWM output pin would go low, thus turning off the transistor. The output on line D1 will go high when the DPWM IC 1010 is selected, 8 bits are clocked in and the chip is deselected.

The CS input from the CS delay circuit 1020 and the input on line K2 from the control latch and shift register 1050 determine if the comparator and associated reference resistors are powered up. When the input signal on line K2 is low and the CS input is low, this says that the comparator and the resistors will be in a power down state. If the CS input goes high, the comparator and resistors will power up. And if the input on line K2 is a logical 1 level, the comparator and resistors will be powered up regardless of the CS input.

The power up and down capability is needed if the chip is to remain powered up under battery operated conditions. The output on line D3 forces an internal reset if either the power on reset circuit is activated or the signal on line K2 dictates a power down condition.

Figure 13:
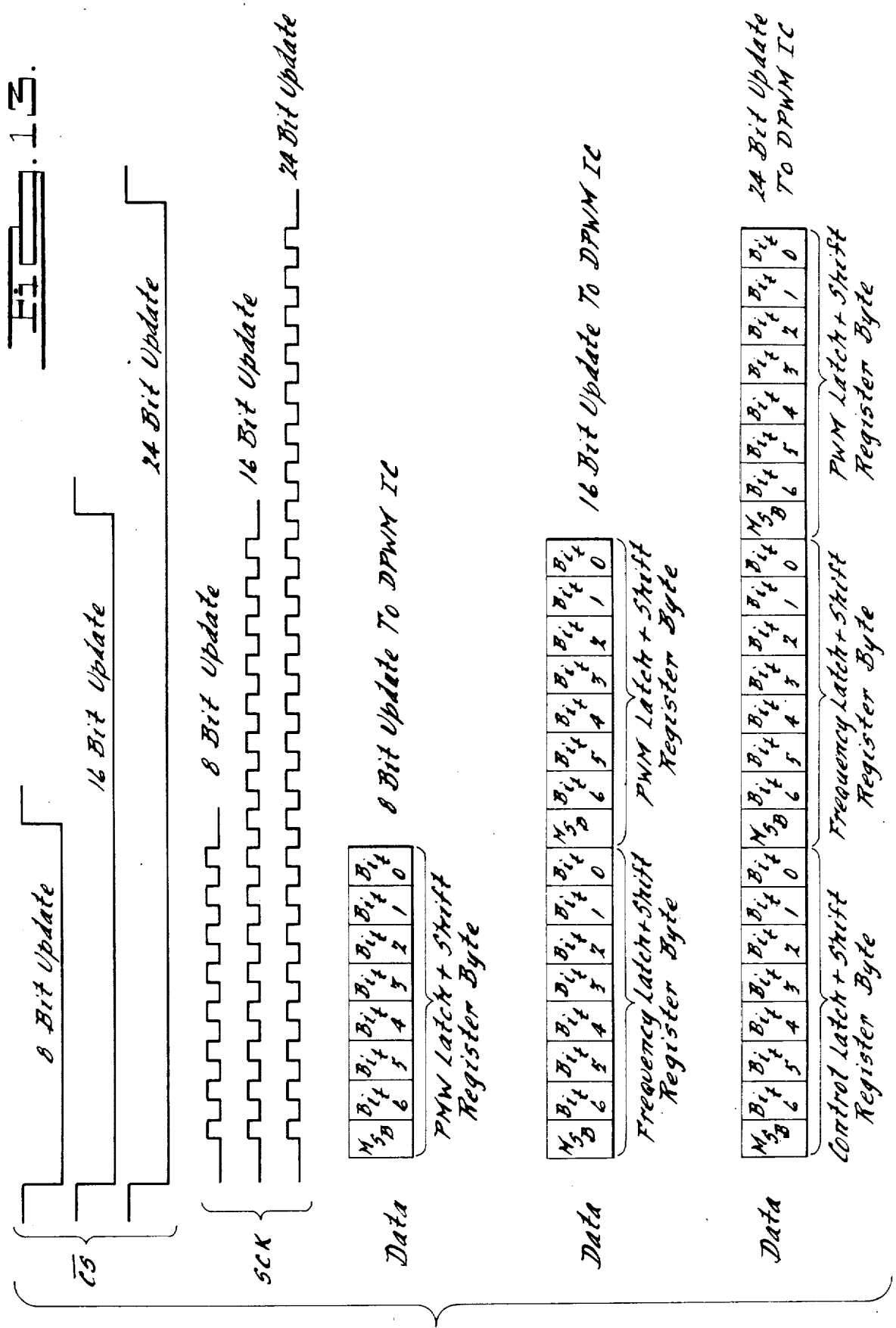
FIG. 13 is a diagram showing the timing relationship of the $\overline{CS}$ and SCK signals vis-a-vis the data formats for an 8 bit, 16 bit and 24 bit update to the DPWM IC.

FIG. 13 is a diagram showing the timing relationship of the $\overline{CS}$ and SCK signals vis-a-vis the data formats for an 8 bit, 16 bit and 24 bit update to the DPWM IC 1010.

While the present invention has been disclosed in connection with the preferred embodiment thereof, it should be understood that there may be other embodiments which fall within the spirit and scope of the invention and that the invention is susceptible to modification, variation and change without departing from the proper scope or fair meaning of the following claims.

I claim:

1. In a microcomputer system with a serial peripheral interface (SPI) for data bit transfers to use peripherals, a digital pulse width modulator (DPWM) for varying the frequency and pulse width of a waveform as desired by a user microcomputer, the digital pulse width modulator comprising:

a chip select (CS) delay circuit;
   a pulse width modulator (PWM) latch and shift register;
   a frequency latch and shift register;
   a control latch and shift register;
   a clock divider;
   a frequency down counter;
   a PWM down counter;
   a jam control circuit;
   an output control circuit;
   a serial clock (SCK) counter and latch decoder;
   an over-voltage sense and latch circuit;
   the CS delay circuit connected and configured in the DPWM to prevent updates to the PWM latch and shift register and control latch and shift register, while the PWM down counter and frequency down counter are being refreshed;
   the PWM latch and shift register connected and configured in the DPWM to receive data from the user microcomputer when clocked by the SCK counter and latch decoder and to pass data into the PWM down counter;
   the frequency latch and shift register connected and configured in the DPWM to receive data from the user microcomputer when clocked by the SCK counter and latch decoder and to pass data into the frequency down counter;
   the control latch and shift register connected and configured in the DPWM to receive data from the user microcomputer when clocked by the SCK counter and latch decoder and to determine how the data is to be divided and whether the DPWM is to be in a power up or power down mode;
   the clock divider connected and configured in the DPWM to generate and present clock signals throughout the DPWM;
   the frequency down counter connected and configured in the DPWM to set up the repetition rate for a DPWM output frequency;
   the PWM down counter connected and configured in the DPWM to set up the pulse width for a DPWM output frequency;
   the jam control circuit connected and configured in the DPWM to generate a signal when the frequency down counter has overflowed;
   the output control circuit connected and configured in the DPWM to determine when the DPWM will present an output signal and to present the output signal;
   the SCK counter and latch decoder connected and configured in the DPWM to count the number of SCK pulses that enter the DPWM and determine, based on the number of SCK Pulses, which latches get updated from the data in the shift registers; and
   the over-voltage sense and latch circuit connected and configured to sense when an external voltage exceeds a predetermined level thereby latching the DPWM output off.

2. The DPWM of claim 1 wherein the PWM latch and shift register, the frequency latch and shift register are individually controlled to alter the pulse width, or the frequency and pulse width, of the output signal without changing the state of a latch in the control latch and shift register.

3. The DPWM of claim 1 wherein the DPWM can be controlled by an interface of a microcomputer.

4. The DPWM of claim 1 wherein the DPWM can be controlled by a serial peripheral interface of a microcomputer.

* * * * *